(12) United States Patent
Camacho et al.

(10) Patent No.: US 7,960,815 B2
(45) Date of Patent: Jun. 14, 2011

(54) LEADFRAME DESIGN FOR QFN PACKAGE WITH TOP TERMINAL LEADS

(75) Inventors: Zigmund R. Camacho, Singapore (SG); Henry D. Bathan, Singapore (SG); Jose Alvin Santos Caparas, Singapore (SG); Lionel Chien Hui Tay, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 120 days.

(21) Appl. No.: 12/398,806

(22) Filed: Mar. 5, 2009

(65) Prior Publication Data

US 2009/0166821 A1    Jul. 2, 2009

Related U.S. Application Data

(62) Division of application No. 11/689,645, filed on Mar. 22, 2007, now Pat. No. 7,517,733.

(51) Int. Cl.
*H01L 23/495* (2006.01)
*H01L 23/48* (2006.01)

(52) U.S. Cl. ............ 257/666; 257/784; 257/E23.047

(58) Field of Classification Search ............ 257/666, 257/784, E23.047
See application file for complete search history.

(56) References Cited

U.S. PATENT DOCUMENTS

| | | | |
|---|---|---|---|
| 5,428,248 A * | 6/1995 | Cha | 257/676 |
| 5,436,492 A * | 7/1995 | Yamanaka | 257/433 |
| 5,583,371 A * | 12/1996 | Hori | 257/675 |
| 6,329,705 B1 * | 12/2001 | Ahmad | 257/666 |
| 6,427,976 B1 * | 8/2002 | Huang et al. | 257/676 |
| 6,821,817 B1 * | 11/2004 | Thamby et al. | 438/112 |
| 2008/0036051 A1 * | 2/2008 | Espiritu et al. | 257/666 |

* cited by examiner

*Primary Examiner* — Nitin Parekh
(74) *Attorney, Agent, or Firm* — Robert D. Atkins; Patent Law Group

(57) ABSTRACT

A semiconductor package includes a leadframe. A first lead finger has a lower portion, a connecting portion extending vertically upward from the lower portion, and a substantially flat, top portion. The top portion forms a top terminal lead structure. A second lead finger is electrically connected to the first lead finger. A portion of the second lead finger forms a bottom terminal lead structure. A portion of the second lead finger corresponds to a bottom surface of the semiconductor package. A surface of the substantially flat, top portion corresponds to a top surface of the semiconductor package.

25 Claims, 4 Drawing Sheets

LEADFRAME DESIGN FOR QFN PACKAGE WITH TOP TERMINAL LEADS

CLAIM TO DOMESTIC PRIORITY

The present application is a division of, claims priority to, and fully incorporates herein by reference U.S. patent application Ser. No. 11/689,645, filed Mar. 22, 2007.

FIELD OF THE INVENTION

The present invention relates in general to semiconductor devices and, more particularly, to a leadframe design for quad flat nonleaded (QFN) semiconductor package structures.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As the demand for semiconductor devices with low-cost, high performance, increased miniaturization, and greater packaging densities has increased, Multi-Chip Module (MCM) structures have been developed to meet the demand. MCM structures have a number of dies and other semiconductor components mounted within a single semiconductor package. The number of dies and other components can be mounted in a vertical manner, a lateral manner, or combinations thereof.

One such approach is to stack one die on top of another and then enclose the stack of dies in one package. The final package for a semiconductor with stacked dies is much smaller than would result if the dies were each packaged separately. In addition to providing a smaller size, stacked-die packages offer a number of advantages that relate to the manufacturing of the package, such as ease of handling and assembly.

In a stacked-die arrangement, the dies are wire-bonded sequentially, typically with automated wire-bonding equipment employing well-known thermal compression or ultrasonic wire-bonding techniques. During the wire-bonding process, the head of a wire-bonding apparatus applies a downward pressure on a conductive wire held in contact with a wire-bonding pad on the die to weld, or bond, the wire to the bonding pad on the die.

In many cases, stacked-die semiconductors can be fabricated faster and more cheaply than several semiconductors, each having a single die, which perform the same functions. A stacked-die approach is advantageous because of the increase in circuit density achieved.

For semiconductor package configurations having stacked die arrangements such as so-called "package-on-package" (POP) or "package-in-package" (PIP) configurations, there is a need for a configuration incorporating a leadframe design having electrically connected top and bottom terminal leads. Current designs and methods are limited and more complex.

SUMMARY OF THE INVENTION

Accordingly, in one embodiment, the present invention is a leadframe for a semiconductor package, comprising a first lead finger electrically connected to a second lead finger, wherein the first lead finger is pivoted to extend a portion of the first lead finger vertically upward and terminate the first lead finger along a substantially flat surface corresponding to a top surface of the semiconductor package.

In another embodiment, the present invention is a leadframe for a semiconductor package, comprising a first lead finger having a lower portion, a connecting portion extending vertically upward from the lower portion, and a substantially flat, top portion, the top portion forming a top terminal lead structure, and a second lead finger electrically connected to the first lead finger, a portion of the second lead finger forming a bottom terminal lead structure.

In still another embodiment, the present invention is a method of fabricating a leadframe for a semiconductor package, comprising forming a first lead finger electrically connected to a second lead finger, the first lead finger having a lower portion, forming a pivot in a first portion of the first lead finger to render a connecting portion extending vertically upward from the lower portion, and forming a pivot in a second portion of the first lead finger to render a substantially flat, top portion to serve as a top terminal lead structure.

In still another embodiment, the present invention is a method of manufacturing a leadframe for a semiconductor device, comprising providing a first lead finger electrically connected to a second lead finger, wherein the first lead finger is pivoted to extend a portion of the first lead finger vertically upward and terminate the first lead finger along a substantially flat surface corresponding to a top surface of the semiconductor package.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor package configuration known as a QFP or Quad Flat Package is an integrated circuit package with leads extending from each of the four sides. It is used for surface mounting applications. Versions of QFPs range from thirty two (32) to over two hundred (200) pins with a pitch ranging from 0.4 to 1.0 millimeters. Versions such as Low Profile (LQFP) and Thin (TQFP) packages are available.

A package configuration known as a Quad Flat Nonleaded (QFN) package is similar to a QFP, however, respective leads do not extend out of the QFN package. With a hidden lead and a characteristic of tightly sticking to circuit boards during bonding, QFN packaging meets the demand of being light, thin, simple and compact for modern electrical components, especially components used in mobile electronics, such as cellular phone or notebook computers.

The present invention introduces a simple leadframe design for use in semiconductor packaging configurations such as a QFN package. The described leadframe design provides a means of creating electrically connected terminal pads on both top and bottom sides in a semiconductor package such as a familiar QFN package outline and footprint. In a departure from the prior art, the leadframe itself provides the top and bottom terminal lead structures.

Figure 1:
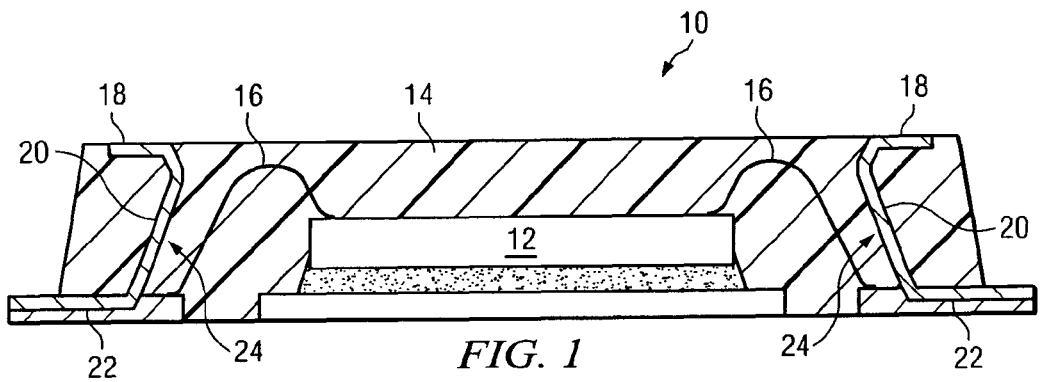
FIG. 1 illustrates an example embodiment of a leadframe structure integrated into a quad flat nonleaded (QFN) semiconductor package.

Turning to FIG. 1, a leadframe according to the present invention is integrated into a familiar QFN package configuration 10. Package 10 includes an integrated die 12 which is surrounded by encapsulant 14. Wire bonds 16 are shown electrically connecting the die to the leadframe. The leadframe includes a top terminal lead 18, having a substantially flat surface, which corresponds to a top surface of the package 10.

The leadframe also includes a connecting portion 20, which provides electrical connectivity from a bottom terminal lead portion 22 to the top terminal lead portion 18. The top terminal lead 18 and bottom terminal lead 22 remain electrically connected after a package 10 is singulated from a plurality of packages 10 in the manufacturing process. Connecting portion 20 extends in a relatively vertical direction. As will be described, the degree of slope (i.e., variation from vertical) can vary accordingly to suit a particular application.

Figure 2A:
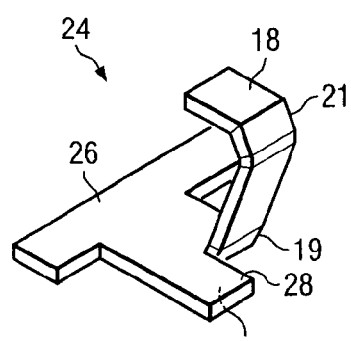
FIG. 2A illustrates an example leadframe structure according to the present invention in a three-dimensional representation.

FIG. 2A illustrates the leadframe structure 24 of FIG. 1 in an isometric representation. A dambar structure 26 can block (dams) the flow of molding compound to lead areas of the leadframe 24 during a molding cycle, and hold the leadframe in place during a manufacturing step. Dambar 26 is configured as shown similarly to dambar 26 structures in familiar QFN packaging manufacturing processes. The dambar structure 26 is later removed in a subsequent manufacturing step before a device such as a package 10 is electrically tested. A top terminal input/output (I/O) lead 18 is shown. Bottom terminal I/O lead 22 is also shown, including a lead finger portion with a bonding side 28 and a bottom surface 30.

Figure 2B:
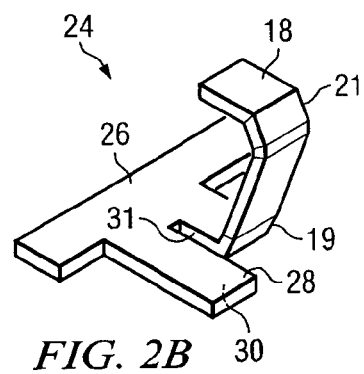
FIG. 2B illustrates a second example leadframe structure according to the present invention, also in a three-dimensional representation.

FIG. 2B illustrates an additional example of a leadframe structure 24. Here again, a dambar structure 26 is presented, as are bottom terminal lead 22, bonding side 28 and bottom surface 30. In the present example, the surfaces 28 and 30 are separated from the top terminal lead portion (e.g., portion 18 by gap 31, which can be varied in shape to suit a particular application.

Figure 2C:
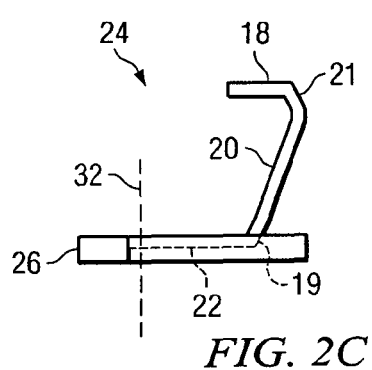
FIG. 2C illustrates the leadframe structure of FIG. 2A in a side-view representation.
Figure 2D:
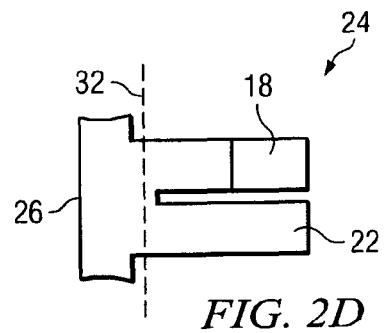
FIG. 2D illustrates the leadframe structure of FIG. 2C in a top-view representation.

FIGS. 2C and 2D illustrates the leadframe structure 24 in a side view and top view, respectively. Again, a top terminal lead portion 18 is shown connected to a bottom terminal lead portion 22 via connecting portion 20. Dambar 26 is again shown, along with a singulation line 32. FIG. 2C illustrates top terminal lead 18 and bottom terminal lead 22 having a finger shape which extend horizontally outward from the singulation line 32. Consequently, throughout the following, reference will be made to "lead finger" structures, which are intended to refer to the finger-like shape and dimensions of portions of the leadframe 24 and similar embodiments as seen.

FIGS. 2A-2D illustrate that the top terminal lead finger is adapted to make pivoting turns. The first pivot 19 allows the connecting portion 20 to extend vertically from the plane corresponding to the bottom terminal lead. Depending on the severity of the pivot 19, the slope of connecting portion 20 can be made to vary to suit a particular application.

A second pivot 21 allows a portion of the top terminal lead finger to have a substantially flat surface to receive a wire bond from an additional semiconductor die 12, for example. Pivot 21 also varies with pivot 19 in order to render the portion 18 as substantially flat.

In one embodiment, the pivots 19, and 21, can be made by bending the top lead finger structure to form a predetermined shape using a manufacturing tool which is known in the art. However, other methods known in the art can be utilized to form the pivots 19 and 21 and requisite portions 18 and 20.

As methods and manufacturing tools known in the art can be used to form the leadframe design, materials known in the art can be used to form the leadframe structure. Copper (Cu), copper alloy materials, and a wide range of metal and metal alloy materials can be utilized in the fabrication of the leadframe to suit a particular application.

In one embodiment, the lower lead 22 can be 0.4 millimeters in length. The connecting portion 20 can be 0.56 millimeters in length. The upper lead 18 can be 0.4 millimeters in length. As one skilled in the art will appreciate, however, various lengths of lead portions 18, 20, and 22 can be implemented to suit a particular application.

Figure 3A:
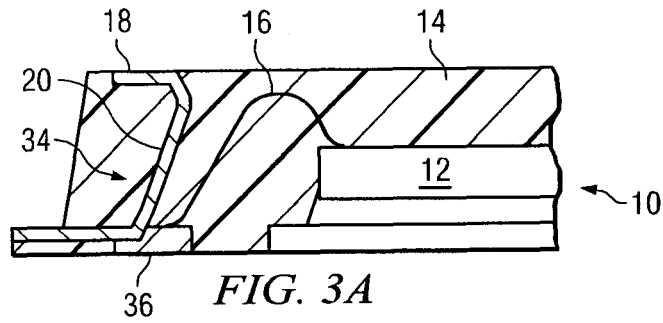
FIG. 3A illustrates an example leadframe structure having an etched bottom terminal lead surface.

Turning to FIG. 3A, an additional embodiment of the present invention is depicted. Here again, a portion of package 10 is depicted having die 12, encapsulant 14 and wire bond 16. In the present embodiment, leadframe 34 includes a similar top terminal lead 18 design. However, a portion of the bottom terminal lead 36 is etched away as shown. In one embodiment, the respective portion of the bottom terminal lead is "half-etched."

Figure 3B:
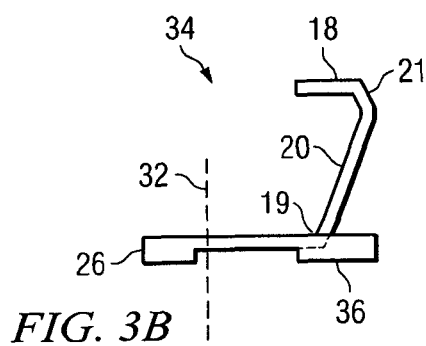
FIG. 3B illustrates the leadframe structure of FIG. 3A in a side-view representation.

FIG. 3B shows the leadframe 34 having a half-etched design along a bottom surface of bottom terminal lead 36 in a side view. Half etching the bottom terminal lead 36 serves to reduce the width of the lead 36. The half-etched portion of the lead 36 is encapsulated and not exposed. Reducing the exposure of the lead 36 makes a bottom surface of the package 10 consistent with conventional packaging footprints, such as a QFN footprint.

Figure 3C:
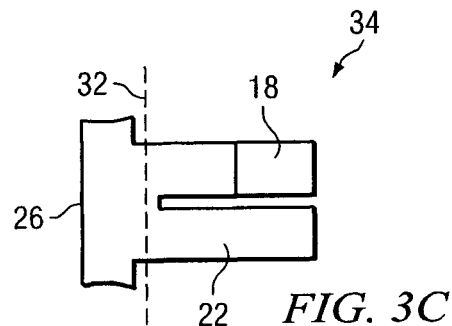
FIG. 3C illustrates the leadframe structure of FIG. 3A in a top-view representation.

FIG. 3C illustrates the embodiment of leadframe 34 in a top view. Again, bottom and top terminal lead portions 18, and 22, are depicted as finger shaped, while dambar 26 portion is removed along singulation line 32 in a manufacturing step.

Figure 4A:
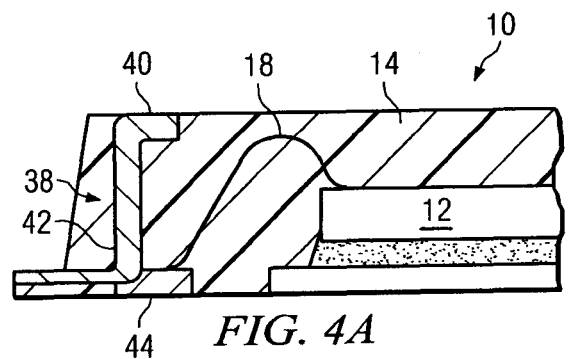
FIG. 4A illustrates an addition embodiment of a leadframe structure according to the present invention.

Turning to FIG. 4A, a separate embodiment of a leadframe 38 is seen integrated into a package 10. Leadframe 38 is configured in a different shape to suit a particular packaging application. Differing types, including differing shapes, of leadframe structures (e.g., leadframes 24, 34, or 38) can be implemented within any one package or multiple package configurations to suit any particular application.

Leadframe 38 includes a top terminal lead 40, a connecting portion 42, and a bottom terminal lead 44, again half-etched in the depicted embodiment. In the depicted embodiment, a portion of a first of two lead finger pairs is formed so that connecting portion 42 is oriented in an orthogonal position to bottom terminal lead portion 44. Connecting portion 42 again extends vertically upward from a bottom plane corresponding to the bottom portion 44. The top terminal lead portion 40 of the lead finger is formed over as shown to render a substantially flat bonding surface 40.

Figure 4B:
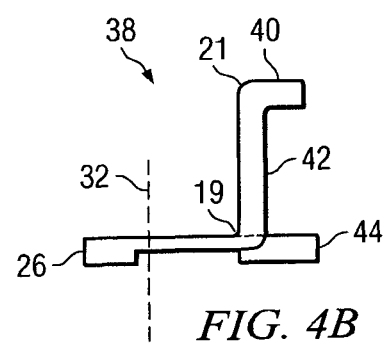
FIG. 4B illustrates the leadframe structure of FIG. 4A in a side-view representation.
Figure 4C:
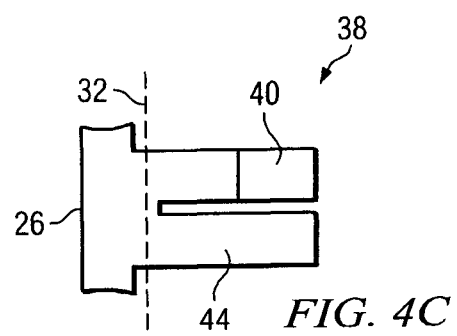
FIG. 4C illustrates the leadframe structure of FIG. 4A in a top-view representation.

FIG. 4B illustrates the leadframe 38 of FIG. 4A in a side view representation. Again, a dambar portion 26 is shown which is later singulated along singulation line 32. FIG. 4C illustrates the leadframe 38 in a top view representation.

The top and bottom terminal lead portions are intended to remain electrically connected after singulation. In the previously depicted embodiments, a portion of the two lead finger pairs is connected together (beyond the singulation line 32) and remains connected after the dambar 26 is removed in a manufacturing step.

Figure 5A:
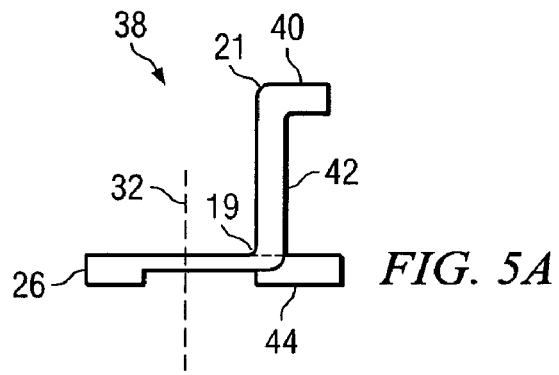
FIG. 5A illustrates a wirebonding option for a leadframe structure in a side-view representation.
Figure 5B:
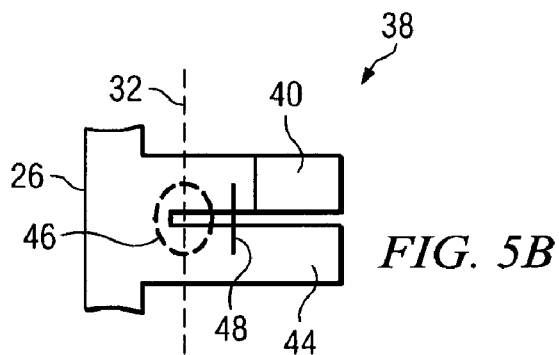
FIG. 5B illustrates a wirebonding option for a leadframe structure in a top-view representation.

In some embodiments, the two lead finger pairs may not share a connection point beyond the singulation line. Such a configuration is shown in FIGS. 5A and 5B, where leadframe 38 is again depicted in an embodiment as described in a side and top view, respectively. As FIG. 5B shows, the region 46 includes a gap or void between the first lead finger structure 40 (a portion of which forms the top terminal lead), and the second lead finger structure 44 (again, a portion of which forms the bottom terminal lead). As a result, the first and second lead finger structures are electrically isolated subsequent to singulation.

A wire bond 48 or similar wire connection 48 can be utilized to interconnect the top and bottom lead finger structures as shown to maintain electrical connectivity. Again, as one skilled in the art will appreciate, a connecting structure which connects the two lead finger pairs upon singulation (as depicted in FIG. 1), or the use of a wire bond 48, can be implemented as needed to suit a particular application.

Figure 6A:
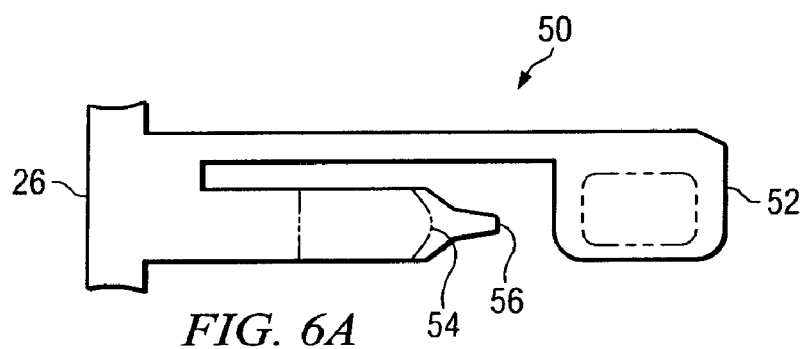
FIG. 6A illustrates a leadframe structure according to the present invention including an offset top terminal lead structure before forming.

Turning to FIG. 6A, an additional embodiment of a leadframe 50 is shown in a manufacturing step before the top terminal lead and bottom terminal lead forms are finalized. In the depicted embodiment, an offset tab structure 52 is integrated into the top lead finger portion as shown. The bottom lead finger 54 includes an extended tip 56 structure to allow for certain wire bonding applications.

Figure 6B:
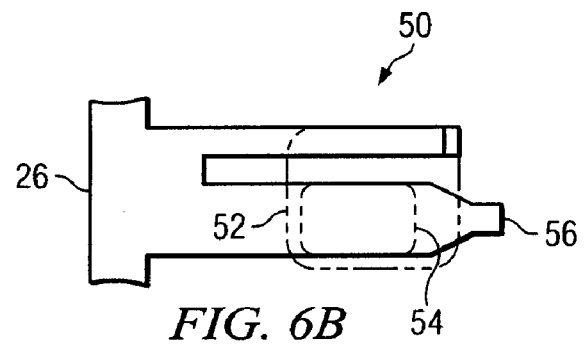
FIG. 6B illustrates a leadframe structure according to the present invention including an offset top terminal lead structure after forming.

As shown in FIG. 6B, where the offset top terminal lead design of leadframe 50 is depicted once the leadframe is formed, the offset tab structure 52 allows the top terminal lead portion 52 to become horizontally and vertically aligned with the bottom terminal lead portion 54. The correction of top and bottom terminal leads using the offset tab structure 52 allows the top terminal lead 52 to have a layout aligned and exactly the same as that of the bottom terminal lead 54 to enable multiple stacking of similar packages 10.

Figure 7A:
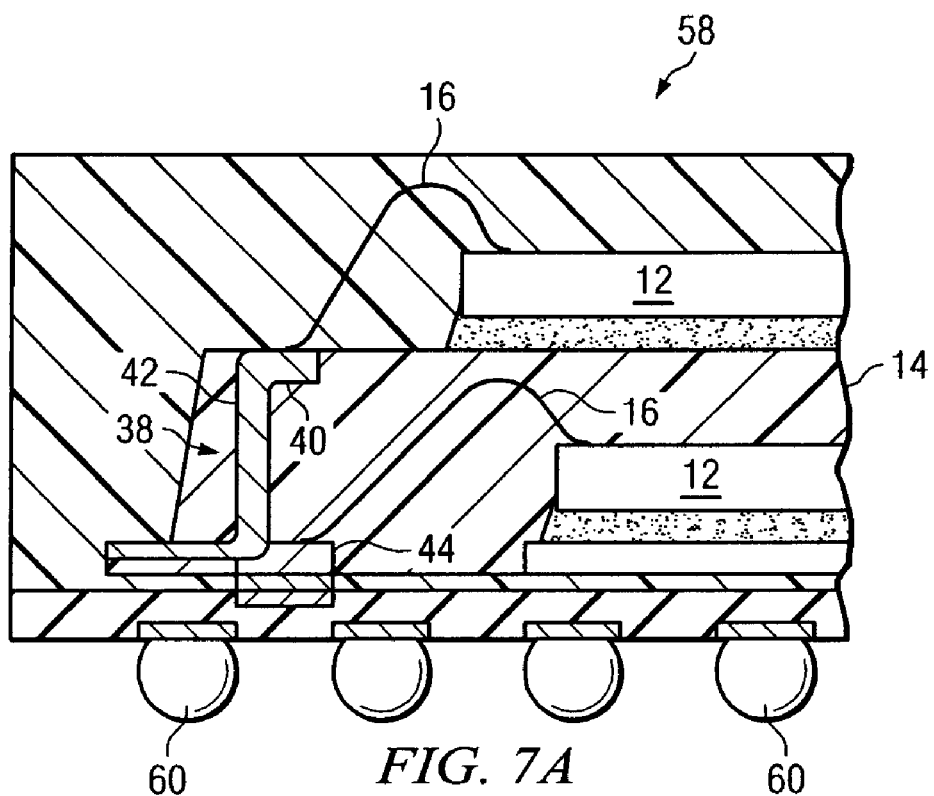
FIG. 7A illustrates one embodiment of the present invention for use in package-in-package (PIP) configurations.

FIG. 7A illustrates an embodiment of leadframe 38 integrated into a PIP configuration 58 having a plurality of solder balls 60 as depicted. A leadframe 38 is integrated into a first package having a die 12, encapsulant 14 and wire bond 16 as shown. The wire bond 16 is attached to a half-etched, bottom terminal lead 44. Again, leadframe 38 includes a top terminal lead portion 40. A second die 12 is wire bonded to the top terminal lead portion 40 as shown, again using wire bond 16.

Figure 7B:
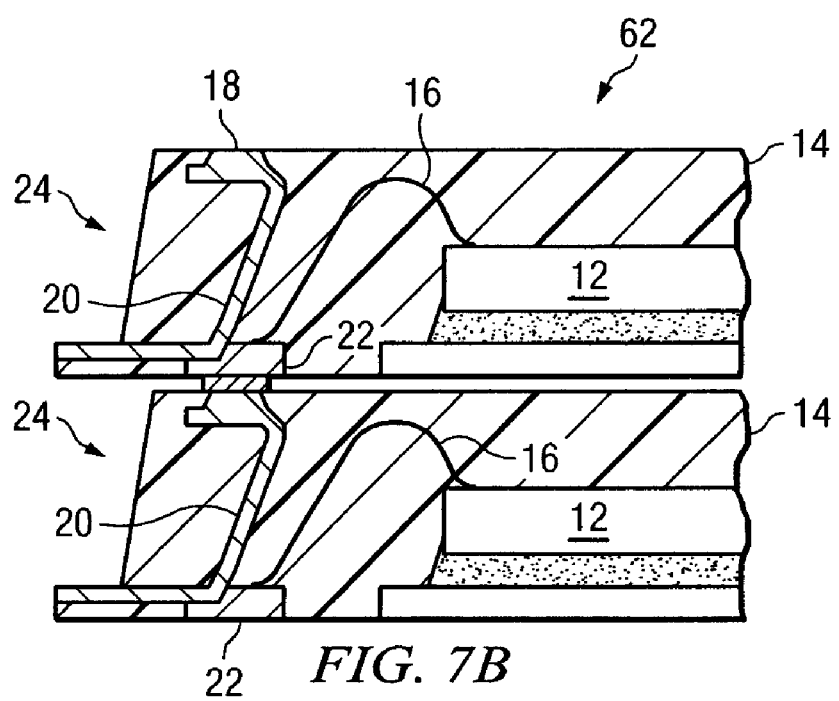
FIG. 7B illustrates one embodiment of the present invention for use in stacked package configurations.

FIG. 7B illustrates a leadframe 24 integrated into a POP configuration 62. Again, multiple dies 12, encapsulant 14, and wire bonds 16 are shown. The wire bonds 16 are attached to the bottom terminal lead 22 portions of the leadframe 24. In the depicted embodiment, the leadframes 24 receive offset correction (as depicted in FIGS. 6A and 6B) to align the top terminal lead portion 18 with the bottom terminal lead portion 22 and provide for the precise stacking of packages in the depicted configuration 62.

A leadframe such as leadframe 24, or leadframe 38, can be constructed using the example method of fabrication. A lead finger pair can be formed, including a first lead finger which is connected to a second lead finger. The lead finger pair can be coupled to a dambar structure to provide support. A portion of the first lead finger can be designated to serve as a top terminal lead structure. Similarly, a portion of the second lead finger can be designated to serve as a bottom terminal lead structure.

A pivot can be formed in a first portion of the first lead finger to form a connecting portion as described which extends in a vertical direction from a plane corresponding to a surface of the bottom terminal lead structure. A second pivot can be formed in a second portion of the first lead finger to render a substantially flat, top surface to serve as the top terminal lead structure.

Once the leadframe is formed, various subcomponents of a respective semiconductor package can be connected to the leadframe using wire bonds, for example. The leadframe and package subcomponents (dies, etc.), can then be encapsulated with a familiar encapsulant, forming the semiconductor package. The top terminal lead corresponds to a top surface of the semiconductor package, while the bottom terminal lead corresponds with a bottom surface of the semiconductor package. As such, in many embodiments, a surface of the top and bottom terminal lead structures are left exposed (i.e., not covered with encapsulant) in order to receive a wire bond or a bond pad, for example.

The use of the leadframe designs as described involves new concepts suitable for semiconductor packages such as QFNs. Because the leadframe includes a top and bottom terminal lead structure, the manufacturing, and particularly, assembly process in such semiconductor devices is made less complex and costs are reduced.

While one or more embodiments of the present invention have been illustrated in detail, the skilled artisan will appreciate that modifications and adaptations to those embodiments may be made without departing from the scope of the present invention as set forth in the following claims.

What is claimed:
1. A leadframe for a semiconductor package, comprising:
   a first lead finger including,
      a lower portion,
      a connecting portion that extends vertically upward from the lower portion, and
      a top terminal coupled to the connecting portion and configured to be coplanar with a top surface of the semiconductor package, the top terminal extending over the lower portion of the first lead finger; and a second lead finger electrically connected to the first lead finger, a portion of the second lead finger forming a bottom terminal configured to be coplanar with a bottom surface of the semiconductor package opposite the top surface of the semiconductor package, a maximum package height existing between the top and bottom surfaces of the semiconductor package, and a portion of the bottom terminal etched to reduce an area of the bottom terminal.

2. The leadframe of claim 1, further including a dambar structure coupled to the first lead finger which is singulated during a manufacturing step.

3. The leadframe of claim 1, further including a wire bond coupled between the first and second lead fingers to provide electrical connectivity.

4. The leadframe of claim 1, wherein the first lead finger is bent in a manufacturing step to form a pivot in the first lead finger.

5. The leadframe of claim 1, wherein the first lead finger further includes an offset tab structure integrated into the first lead finger at a first end, the offset tab structure configured to align the top terminal with the bottom terminal.

6. A leadframe for a semiconductor package, comprising:
a first lead finger having a lower portion, a connecting portion extending vertically upward from the lower portion, and a top portion forming a top terminal configured to be coplanar with a top surface of the semiconductor package; and
a second lead finger electrically connected to the first lead finger, a portion of the second lead finger forming a bottom terminal configured to be coplanar with a bottom surface of the semiconductor package opposite the top surface of the semiconductor package, a maximum package height existing between the top and bottom surfaces of the semiconductor package, wherein a portion of the second lead finger is etched to reduce an area of the bottom terminal.

7. The leadframe of claim 6, further including a dambar structure coupled to the first lead finger which is singulated during a manufacturing step.

8. The leadframe of claim 6, further including a wire bond coupled between the first and second lead fingers to provide electrical connectivity.

9. The leadframe of claim 6, wherein the first lead finger is bent in a manufacturing step to form a pivot in the first lead finger.

10. The leadframe of claim 6, wherein the first lead finger further includes an offset tab structure integrated into the top portion, the offset tab structure configured to align the top terminal with the bottom terminal.

11. The leadframe of claim 6, wherein the top lead structure extends over the lower portion of the first lead finger.

12. A leadframe for a semiconductor package, comprising:
a first lead finger electrically connected to a conductive bar, the first lead finger having a lower portion, a connecting portion, and a top lead structure, the top lead structure extending over the lower portion of the first lead finger; and
a second lead finger connected to the first lead finger and the conductive bar to serve as a lower lead structure for the semiconductor package.

13. The leadframe of claim 12, wherein a portion of the second lead finger is etched to reduce an exposed surface of the second lead finger.

14. The leadframe of claim 12, wherein the lower lead structure corresponds to a bottom surface of the semiconductor package.

15. The leadframe of claim 12, wherein the first and second lead fingers are wire bonded to provide electrical connectivity.

16. The leadframe of claim 12, wherein the top lead structure corresponds to a top surface of the semiconductor package.

17. The leadframe of claim 12, further including a dambar structure coupled to the first lead finger which is singulated during a manufacturing step.

18. A leadframe for a semiconductor package, comprising:
a first lead finger having a lower portion, a connecting portion extending vertically upward from the lower portion, and a substantially flat top portion, the top portion forming a top lead structure exposed at a top surface of the semiconductor package, the top surface being substantially flat and disposed over a semiconductor die; and
a second lead finger electrically connected to the first lead finger, a portion of the second lead finger forming a bottom lead structure exposed at a bottom surface of the semiconductor package, the bottom surface being substantially flat and disposed under the semiconductor die.

19. The leadframe of claim 12, wherein the first lead finger further includes an offset tab structure integrated into the first lead finger at a first end, the offset tab structure configured to align the top lead structure with the lower lead structure.

20. The leadframe of claim 18, wherein the first lead finger further includes an offset tab structure integrated into the first lead finger at a first end, the offset tab structure configured to align the top lead structure with the bottom lead structure.

21. The leadframe of claim 18, wherein a portion of the second lead finger is etched to reduce an exposed surface of the second lead finger.

22. The leadframe of claim 18, wherein the first and second lead fingers are wire bonded to provide electrical connectivity.

23. The leadframe of claim 18, further including a dambar structure coupled to the first lead finger which is singulated during a manufacturing step.

24. The leadframe of claim 18, wherein the top lead structure extends over the lower portion of the first lead finger.

25. The leadframe of claim 18, wherein the first lead finger is bent in a manufacturing step to form a pivot in the first lead finger.

* * * * *